United States Patent
Liu et al.

(10) Patent No.: US 10,127,850 B2
(45) Date of Patent: Nov. 13, 2018

(54) FIELD SEQUENTIAL DISPLAY PANEL, FIELD SEQUENTIAL DISPLAY DEVICE AND DRIVING METHOD USING AN ORGANIC LIGHT EMITTING DIODE (OLED) LIGHT SOURCE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Peng Liu, Beijing (CN); Xiaochuan Chen, Beijing (CN); Xue Dong, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 6 days.

(21) Appl. No.: 15/039,673

(22) PCT Filed: Oct. 23, 2015

(86) PCT No.: PCT/CN2015/092682
§ 371 (c)(1),
(2) Date: May 26, 2016

(87) PCT Pub. No.: WO2016/192278
PCT Pub. Date: Dec. 8, 2016

(65) Prior Publication Data
US 2017/0110043 A1    Apr. 20, 2017

(30) Foreign Application Priority Data
May 29, 2015 (CN) .......................... 2015 1 0289387

(51) Int. Cl.
*G09G 3/30* (2006.01)
*G09G 3/20* (2006.01)
(Continued)

(52) U.S. Cl.
CPC ..... *G09G 3/2003* (2013.01); *G02F 1/133603* (2013.01); *G02F 1/133621* (2013.01);
(Continued)

(58) Field of Classification Search
CPC ............ G09G 3/30; G09G 3/32; G09G 3/342; G09G 3/36; G09G 3/2003; G09G 3/3208;
(Continued)

(56) References Cited

U.S. PATENT DOCUMENTS 6,480,247 B1   11/2002 Moon
9,898,972 B2 * 2/2018 Liu ...................... G09G 3/3413
(Continued)

FOREIGN PATENT DOCUMENTS

CN      1434969 A     8/2003
CN      101435935 A   5/2009
(Continued)

OTHER PUBLICATIONS

International Search Report and Written Opinion dated Feb. 4, 2016; PCT/CN2015/092682.
(Continued)

*Primary Examiner* — Alexander Eisen
*Assistant Examiner* — Nelson Lam
(74) *Attorney, Agent, or Firm* — Ladas & Parry LLP

(57) ABSTRACT

A field sequential display panel, a field sequential display device and a driving method are provided. The field sequential display panel includes: a lower substrate, including a base substrate and a plurality of pixel units disposed on the base substrate, each of the plurality of pixel units including a thin film transistor; an upper substrate; and a liquid crystal
(Continued)

layer, located between the lower substrate and the upper substrate; an OLED light source, disposed on a side of the base substrate away from the thin film transistor, which is configured for providing trichromatic light for each of the plurality of pixel units, the OLED light source including: a plurality of trichromatic light source units, each trichromatic light source unit including a sub-light-source of a first color, a sub-light-source of a second color and a sub-light-source of a third color, the first color, the second color and the third color are colors different from each other. With the field sequential display panel, the field sequential display device and the driving method, when a color field sequential display method is used, requirement on response time of a liquid crystal can be reduced.

20 Claims, 6 Drawing Sheets

(51) Int. Cl.
  G02F 1/1335  (2006.01)
  G09G 3/3208  (2016.01)
  G09G 3/34    (2006.01)
  G09G 3/36    (2006.01)
  H01L 27/32   (2006.01)
  G02F 1/1362  (2006.01)

(52) U.S. Cl.
  CPC ........... *G09G 3/3208* (2013.01); *G09G 3/342* (2013.01); *G09G 3/3413* (2013.01); *G09G 3/36* (2013.01); *H01L 27/3211* (2013.01); *H01L 27/3232* (2013.01); *H01L 27/3262* (2013.01); *G02F 1/1362* (2013.01); *G02F 2001/133622* (2013.01); *G09G 3/3648* (2013.01); *G09G 2310/0235* (2013.01); *G09G 2320/0646* (2013.01); *G09G 2320/0666* (2013.01)

(58) Field of Classification Search
  CPC .. G09G 3/3216; G09G 3/3225; G09G 3/3233; G09G 3/3241; G09G 3/3406; G09G 3/3413; G09G 3/2018; G09G 3/2022; G09G 3/2025; G09G 3/2029
  USPC ..................... 345/76–83, 87–104; 315/169.3
  See application file for complete search history.

(56) References Cited

U.S. PATENT DOCUMENTS

| | | |
|---|---|---|
| 2004/0027677 A1 | 2/2004 | Okita |
| 2006/0109397 A1* | 5/2006 | Anandan ........... G02F 1/133603 349/69 |
| 2007/0097705 A1* | 5/2007 | Jung ................. G02F 1/133606 362/613 |
| 2008/0151144 A1* | 6/2008 | Hirose ............. G02F 1/133603 349/69 |
| 2008/0204382 A1* | 8/2008 | Lim ..................... G09G 3/3413 345/83 |
| 2008/0224973 A1* | 9/2008 | Louwsma .............. G09G 3/342 345/88 |
| 2009/0135108 A1* | 5/2009 | Lindfors .............. G09G 3/3426 345/76 |
| 2010/0090937 A1 | 4/2010 | Cheng et al. |
| 2011/0157244 A1* | 6/2011 | Nakano ................ G09G 3/3413 345/690 |
| 2012/0147066 A1* | 6/2012 | Fujiwara .............. G09G 3/3413 345/690 |
| 2014/0226110 A1* | 8/2014 | Doyle ............... G02F 1/133603 349/69 |
| 2014/0267449 A1* | 9/2014 | Hong ................... G09G 3/3659 345/690 |
| 2016/0125822 A1 | 5/2016 | Kang et al. |

FOREIGN PATENT DOCUMENTS

| | | |
|---|---|---|
| CN | 101887183 A | 11/2010 |
| CN | 202813107 U | 3/2013 |
| CN | 104036739 A | 9/2014 |
| CN | 104820315 A | 8/2015 |
| CN | 104821161 A | 8/2015 |
| EP | 0744872 A2 | 11/1996 |
| JP | 2005-077471 A | 3/2005 |
| JP | 2008-066366 A | 3/2008 |
| JP | 2008-083073 A | 10/2008 |

OTHER PUBLICATIONS

First Chinese Office Action dated Apr. 24, 2017; Appln. No. 201510289387.1.
Extended European Search Report dated Sep. 28, 2016; Appln. No. 13840130.2-1903/2961163 PCT/CN2013074650.
The Second Chinese Office Action dated Dec. 22, 2017; Appln. No. 201510289387.1.

* cited by examiner

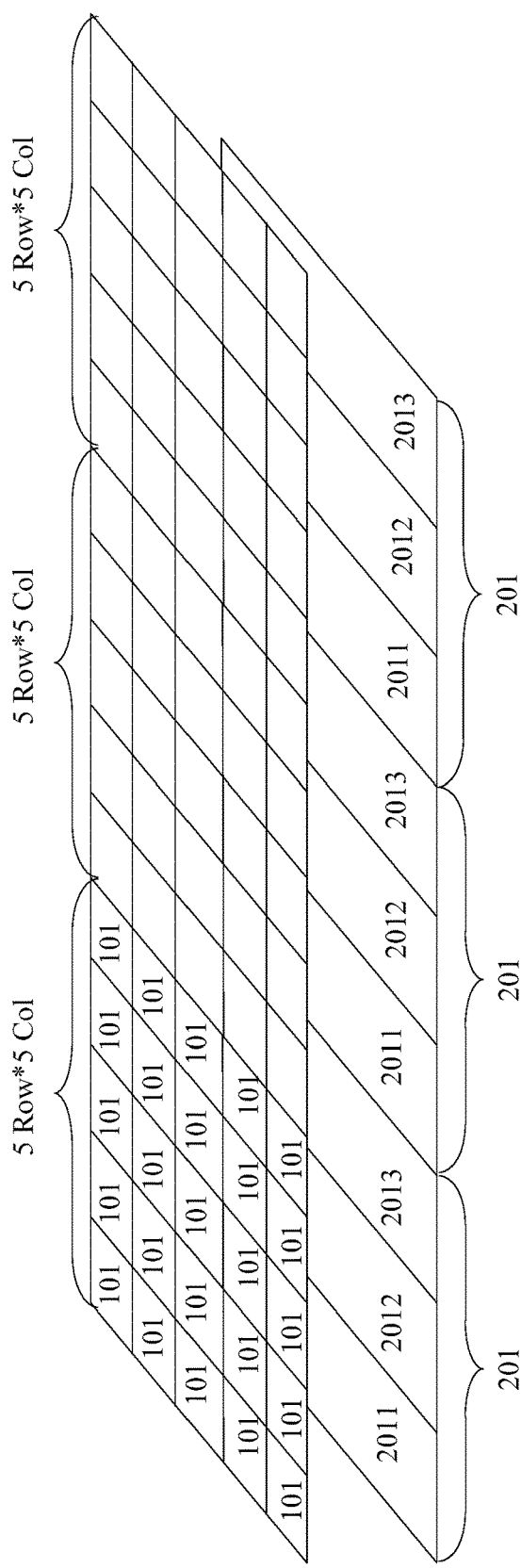

FIELD SEQUENTIAL DISPLAY PANEL, FIELD SEQUENTIAL DISPLAY DEVICE AND DRIVING METHOD USING AN ORGANIC LIGHT EMITTING DIODE (OLED) LIGHT SOURCE

TECHNICAL FIELD

Embodiments of the present disclosure relate to a field sequential display panel, a field sequential display device and a driving method.

BACKGROUND

Currently, one of the methods for a liquid crystal display device to implement color display is a display method by means of a red (R), green (G), blue (B) color filter layer.

For a liquid crystal display device using a display method by means of RGB colors filter layer, each pixel unit is divided into three RGB sub-pixels, and each sub-pixel is provided with a color filter layer of a corresponding color, and light emitted from a backlight is transmitted to an RGB colors filter layer through a liquid crystal, which thereby forms a colorful image. However, the above-described RGB colors filter layer will reduce a transmittance of light emitted from the backlight so as to reduce a luminous flux of the liquid crystal display device.

SUMMARY

Embodiments of the present disclosure relate to a field sequential display panel, a field sequential display device and a driving method, capable of reducing requirements on liquid crystal response time upon a color field sequential display method being employed.

In an aspect, provided is a field sequential display panel, comprising: a lower substrate, including a base substrate and a plurality of pixel units disposed on the base substrate, each of the plurality of pixel units including a thin film transistor; an upper substrate; and a liquid crystal layer, interposed between the lower substrate and the upper substrate; an organic light emitting diode (OLED) light source, disposed on a side of the base substrate away from the thin film transistor, which is configured for providing trichromatic light for each of the plurality of pixel units, the OLED light source including: a plurality of trichromatic light source units, each trichromatic light source unit including a sub-light-source of a first color, a sub-light-source of a second color and a sub-light-source of a third color; the first color, the second color and the third color are colors different from each other.

In another aspect, provided is a field sequential display device, comprising: a liquid crystal display panel, including: an upper substrate and a lower substrate disposed opposite to each other; and a liquid crystal layer, disposed between the upper substrate and the lower substrate; the liquid crystal display panel includes a plurality of pixel units, an organic light emitting diode (OLED) light source, located on a light incident side of the liquid crystal display panel, which is configured for providing trichromatic light for each of the plurality of pixel units of the liquid crystal display panel. The OLED light source including: a plurality of trichromatic light source units, each trichromatic light source unit including a sub-light-source of a first color, a sub-light-source of a second color and a sub-light-source of a third color, wherein, the first color, the second color and the third color are colors different from each other.

In further another aspect, provided is a driving method of the field sequential display panel or the field sequential display device, comprising: driving a sub-light-source of a first color in the OLED light source to emit light in a first field of a first frame, and driving a sub-light-source of a second color in the OLED light source to emit light in a second field of the first frame; driving a sub-light-source of a third color in the OLED light source to emit light in a first field of a second frame, and driving the sub-light-source of the first color in the OLED light source to emit light in a second field of the second frame; the first field of the second frame being next to the second field of the first frame; driving the sub-light-source of the second color in the OLED light source to emit light in a first field of a third frame, and driving a sub-light-source of the third color in the OLED light source to emit light in a second field of the third frame; the first field of the third frame being next to the second field of the second frame; driving liquid crystal in the liquid crystal layer to deflect in each of the first field and the second field, so that light emitted from each of the plurality of pixel units reaches a target brightness value; the first frame, the second frame and the third frame constitute one driving cycle.

In still another aspect, provided is a driving method of the field sequential display panel or the field sequential display device, comprising: driving a sub-light-source of a first color in the OLED light source to emit light in a first field of a first frame, and driving a sub-light-source of a second color in the OLED light source to emit light in a second field of the first frame; driving a sub-light-source of a third color in the OLED light source to emit light in a first field of a second frame, and driving the sub-light-source of the second color in the OLED light source to emit light in a second field of the second frame; the first field of the second frame being next to the second field of the first frame; driving liquid crystal in the liquid crystal layer to deflect in each field, so that light emitted from each of the plurality of pixel units of the liquid crystal layer reaches a target brightness value; the first frame and the second frame constitute one driving cycle.

BRIEF DESCRIPTION OF THE DRAWINGS

In order to clearly illustrate the technical solution in the embodiments of the present disclosure or in the prior art, the drawings necessary for description of the embodiments or the prior art will be briefly described hereinafter; it is obvious that the described drawings are only related to some embodiments of the present disclosure, for which one ordinarily skilled in the art still can obtain other drawings without inventive work based on these drawings.

FIG. 1c is a schematic diagram of a pixel unit corresponding to a trichromatic light source unit in an OLED light source in a liquid crystal display panel provided by an embodiment of the present disclosure;

DETAILED DESCRIPTION

The technical solution in the embodiments of the present disclosure shall be clearly and completely described hereinafter in conjunction with the accompanying drawings in the embodiments of the present disclosure. Apparently, the described embodiments are only part of rather than all of the embodiments of the present disclosure. Based on the described embodiments herein, those skilled in the art can obtain other embodiment(s), without any inventive work, which should be within the scope of the present disclosure.

For a color field sequential display method for implementing color display, it is not necessary to dispose an RGB colors filter layer in a liquid crystal display device, but a light emitting diode (LED) light sources of the RGB colors is disposed for each pixel unit of the display device, deflection angles of liquid crystal molecules corresponding to the pixel unit are controlled in a time sharing manner, and an LED light source of the RGB colors is controlled in a time sharing manner to respectively emit R, G and B light, i.e., trichromatic light which passes the liquid crystal, so that in each frame, the pixel unit displays a corresponding color value.

In this time-sharing control method, the time period of each frame may be divided into three fields; within the time of each field, all the pixel units in a liquid crystal display can undergo scanning of one time, and when a rotation angle of the liquid crystal matches a target transmittance, the backlight of one color (e.g., red) is completely opened. After three sequential fields, the LED lights of the three colors RGB are respectively lightened. In this way, within one frame, a color mixing effect can be achieved by light of the three different colors, so as to form a colorful image. Thus, the color field sequential display method requires the liquid crystal to have a higher response speed, and in terms of response time, it needs to be reduced to ⅓ the time period of an RGB colors filter method.

Figure 1A:
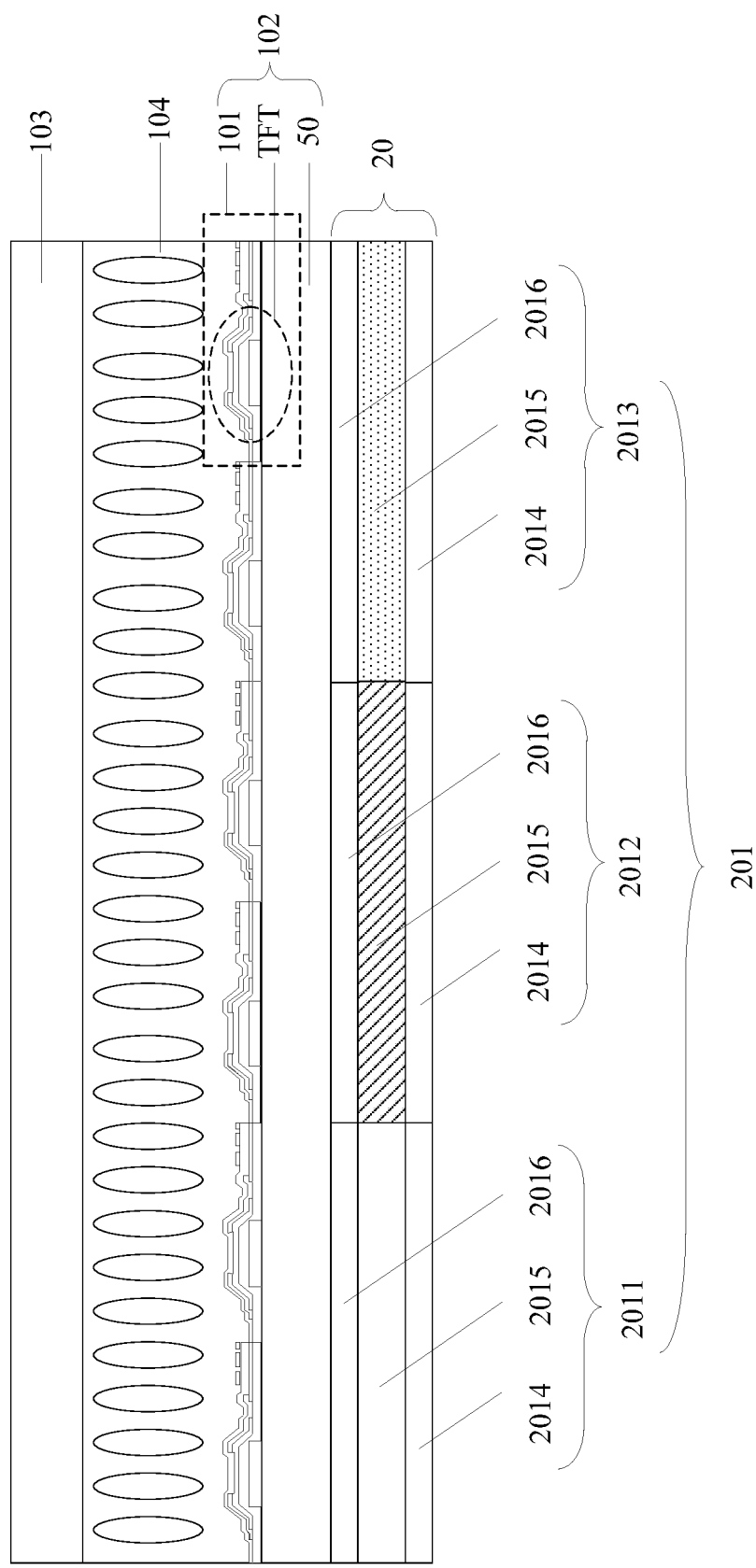
FIG. 1a is a cross-sectional structural diagram of a field sequential display panel provided by an embodiment of the present disclosure.

An embodiment of the present disclosure provides a field sequential display panel, as illustrated in FIG. 1a, comprising a lower substrate 102, an upper substrate 103 and a liquid crystal layer 104 located between the lower substrate 102 and the upper substrate 103. In addition, the lower substrate 102 may include a plurality of pixel units 101 disposed on a base substrate 50, each pixel unit 101 including a thin film transistor (TFT). In addition, the field sequential display panel may further comprise an organic light emitting diode (OLED) light source 20 disposed on a side of the base substrate 50 away from the thin film transistor, which is configured for providing trichromatic light for the pixel unit 101.

Figure 1B:
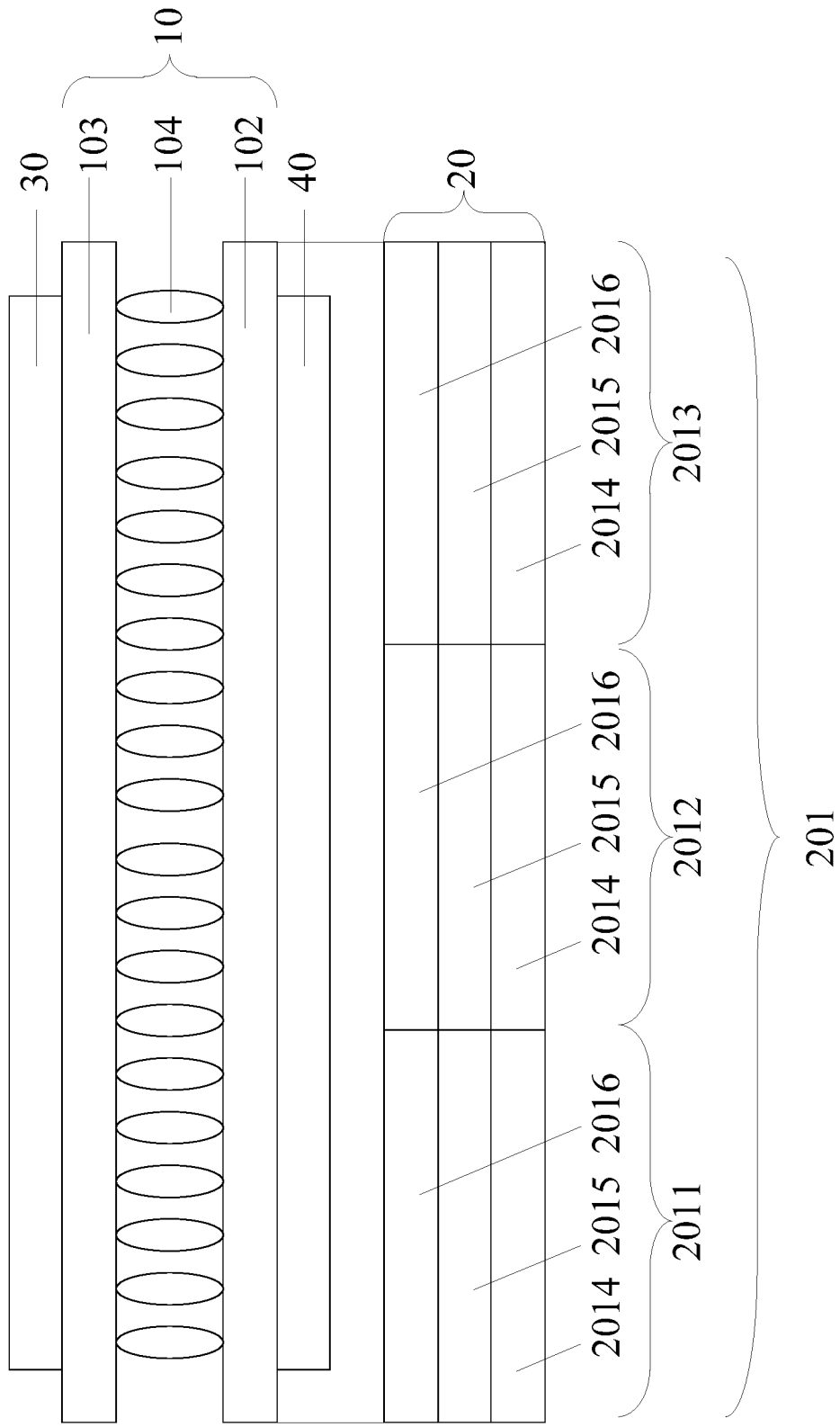
FIG. 1b is a cross-sectional structural diagram of a field sequential display device provided by an embodiment of the present disclosure.

The OLED light source may include: a plurality of trichromatic light source units 201, each trichromatic light source unit 201 including a sub-light-source of a first color 2011, a sub-light-source of a second color 2012, and a sub-light-source of a third color 2013. Each sub-light-source, as illustrated in FIG. 1b, may include an anode 2014, a cathode 2016 and a light emitting layer 2015 located between the anode 2014 and the cathode 2016.

Exemplarily, for the sub-light-source of the first color 2011, a material of the light emitting layer 2015 therein is a material emitting light of the first color; for the sub-light-source of the second color 2012, a material of the light emitting layer 2015 therein is a material emitting light of the second color; and for the sub-light-source of the third color 2013, a material of the light emitting layer 2015 therein is a material emitting light of the third color; the first color, the second color and the third color are different colors from each other.

Further, each sub-light-source, besides the light emitting layer for emitting light of the corresponding color, may further include an electron transport layer and a hole transport layer, and further, in order to be able to improve efficiency of injecting electrons and holes into the light emitting layer, it may also include an electron injection layer disposed between the cathode and the electron transport layer, and a hole injection layer disposed between the anode and the hole transport layer.

Each pixel unit 101 of the lower substrate 102 includes a thin film transistor, a pixel electrode and a common electrode, but does not include a color filter layer; and the thin film transistor includes a gate electrode, a gate insulating layer, a semiconductor active layer, a source electrode and a drain electrode, and the drain electrode is connected with the pixel electrode. Of course, the lower substrate 102 further includes a gate line connected with the gate electrode and a data line connected with the source electrode.

It should be noted that, firstly, the first color, the second color and the third color may be respectively red, green and blue colors, but the embodiments of the present disclosure are not limited thereto, they may be other kinds of three primary colors, for example, cyan, magenta and yellow colors.

Secondly, materials and mutual positions of the anode 2014 and the cathode 2016 in each sub-light-source are not limited, as long as the light emitted from each sub-light-source is transmitted toward the lower substrate 102.

Thirdly, each trichromatic light source unit 201 according to the embodiment of the present disclosure may correspond to a plurality of pixel units 101.

Based on the above, in order that the field sequential display panel displays normally, that is, each pixel unit 101 must be able to receive light of the first color, light of the second color and light of the third color, it is necessary that there is a certain distance (i.e., a thickness of the base substrate 50) between the OLED light source 20 and the pixel unit 101. Therein, the thickness of the base substrate 50 and the number of the pixel units 101 corresponding to the trichromatic light source unit 201 will not be limited in the embodiments of the present disclosure, as long as they can enable each pixel unit 101 of the lower substrate 102 to receive the light emitted from each sub-light-source in the sub-light-source of the first color, the sub-light-source of the second color and the sub-light-source of the third color, and by control of deflection of the liquid crystal, and the pixel unit 101 can be allowed to emit light of the corresponding color which satisfies a required brightness in different timings in one frame.

An embodiment of the present disclosure provides a field sequential display panel, which provides trichromatic light to the lower substrate 102 respectively by using the sub-light-source of the first color 2011, the sub-light-source of the second color 2012 and the sub-light-source of the third color 2013 of the OLED light source 20, so that the liquid crystal display panel 10 can also implement color display without the color filter layer. In an embodiment of the present disclosure, the OLED light source 20 is used as the backlight of the field sequential display panel, which, on one hand, can accurately control switch-on and switch-off of the respective sub-light-sources with higher flexibility, and can accurately control a brightness value of the trichromatic light, so that the field sequential display panel has a better display effect, and on the other hand, can avoid defects of the LED light as the backlight, so that the field sequential display device has better performance.

Exemplarily, the shape of the pixel unit 101 may be a square; and the thickness of the base substrate 50 is less than or equal to 10 times the side length of the pixel unit 101.

Thus, it can be ensured that all the monochromatic sub-light-sources of the OLED light source 20, i.e., light emitted from all the sub-light-sources of the first color 2011, light emitted from all the sub-light-sources of the second color 2012 and light emitted from all the sub-light-sources of the third color 2013 can be mixed uniformly when arriving at the pixel unit 101.

Further, any trichromatic light source unit 201 in the OLED light source 20 corresponds to 4 rows×4 columns or 5 rows×5 columns of the pixel units 101.

Here, if each trichromatic light source unit 201 is made to correspond to fewer pixel units 101, it means that the size of each sub-light-source of the OLED light source 20 become smaller; and if each trichromatic light source unit 201 is made to correspond to more pixel units 101, then in order that the light arriving at the liquid crystal display panel 10 become uniform, it is necessary to increase the distance (i.e., the thickness of the base substrate 50) between the OLED light source 20 and the pixel unit 101. Therefore, in order to integrate the above-described two cases, in an embodiment of the present disclosure, one trichromatic light source unit 201 is made to correspond to 4 rows×4 columns or 5 rows×5 columns of the pixel units 101, that is, the size of the OLED light source 20 is controlled within a reasonable range, so as to be applicable to a conventional process, which can also avoid an excessive thickness of the field sequential display panel.

An embodiment of the present disclosure provides a field sequential display device, as illustrated in FIG. 1b and FIG. 1c, the field sequential display device comprising a liquid crystal display panel 10, an organic light-emitting diode (OLED) light source 20 disposed on the light incident side of the liquid crystal display panel 10, and the OLED light source 20 is used for providing a trichromatic light source for a pixel unit of the liquid crystal display panel 10. Of course, it may further comprise an upper polarizer 30 disposed on the light emergent side of the liquid crystal display panel 10, and a lower polarizer 40 disposed between the liquid crystal display panel 10 and the OLED light source 20.

Here, the OLED light source 20 may include a plurality of trichromatic light source units 201, and each trichromatic light source unit 201 including a sub-light-source of a first color 2011, a sub-light-source of a second color 2012 and a sub-light-source of a third color 2013; and each sub-light-source including an anode 2014, a cathode 2016 and a light emitting layer 2015 located between the anode and the cathode.

Exemplarily, for the sub-light-source of the first color 2011, the material of the light emitting layer 2015 thereof is a material emitting light of the first color; for the sub-light-source of the second color 2012, the material of the light emitting layer 2015 thereof is a material emitting light of the second color; and for the sub-light-source of the third color 2013, the material of the light emitting layer 2015 thereof is a material emitting light of the third color; the first color, the second color and the third color are different colors from each other.

Further, each sub-light-source, besides the light emitting layer for emitting light of the corresponding color, may further include an electron transport layer and a hole transport layer, and further, in order to be able to improve efficiency of injecting electrons and holes into the light emitting layer, it may further include an electron injection layer disposed between the cathode and the electron transport layer, and a hole injection layer disposed between the anode and the hole transport layer.

Each pixel unit 101 of the liquid crystal display panel 10 includes a thin film transistor, a pixel electrode and a common electrode, but does not include a color filter layer; and the thin film transistor includes a gate electrode, a gate insulating layer, a semiconductor active layer, a source electrode and a drain electrode, the drain electrode being connected with the pixel electrode. Of course, the liquid crystal display panel 10 further includes a gate line connected with the gate electrode and a data line connected with the source electrode.

Exemplarily, the thin film transistor and the pixel electrode are disposed on the lower substrate 102 of the liquid crystal display panel 10, the lower substrate 102 is disposed close to the lower polarizer 40; the common electrode either may be disposed on the lower substrate 102, or may be disposed on an upper substrate 103, the upper substrate 103 is disposed close to the upper polarizer 30, and a liquid crystal layer 104 is disposed between the upper substrate 103 and the lower substrate 102.

In the case where the pixel electrode and the common electrode are both disposed on the lower substrate 102, for a lower substrate of an in-plane switch (IPS) type, the pixel electrode and the common electrode are disposed at intervals on a same layer, and both are strip electrodes; for a lower substrate of an advanced-super dimensional switching (ADS) type, the pixel electrode and the common electrode are disposed on different layers; the electrode located above is a strip electrode, and the electrode located below is a plate electrode. Based on the above, the upper substrate includes a black matrix.

It should be noted that, firstly, the first color, the second color and the third color may be respectively red, green and blue colors, but the embodiments of the present disclosure is not limited thereto, they may be other kind of three primary colors, for example, cyan, magenta and yellow colors.

Secondly, materials and mutual positions of the anode 2014 and the cathode 2016 in each sub-light-source are not limited, as long as it is ensured that light emitted from each sub-light-source is transmitted toward the liquid crystal display panel 10.

Thirdly, exemplarily, each trichromatic light source unit 201 according to an embodiment of the present disclosure may correspond to a plurality of pixel units 101 of the liquid crystal display panel 10.

Based on the above, in order that the liquid crystal display panel 10 displays normally, that is, each pixel unit 101 must be able to receive light of the first color, light of the second color and light of the third color, it is necessary that there is a certain distance between the OLED light source 20 and the liquid crystal display panel 10. Here, the distance between the OLED light source 20 and the liquid crystal display panel 10, and the number of the pixel units 101 corresponding to the trichromatic light source unit 201 will not be limited by the embodiment of the present disclosure, as long as they can enable each pixel unit 101 of the liquid crystal display panel 10 to receive light emitted from each sub-light-source in the sub-light-source of the first color, the sub-light-source of the second color and the sub-light-source of the third color, and by control of deflection of the liquid crystal, and the pixel unit 101 is allowed to emit light of the corresponding color which satisfies a required brightness in different timings in one frame.

An embodiment of the present disclosure provides a field sequential display device, which provides trichromatic light to the liquid crystal display panel 10 respectively by using the sub-light-source of the first color 2011, the sub-light-source of the second color 2012 and the sub-light-source of the third color 2013 of the OLED light source 20, so that it can also implement color display without the color filter layer. Here, in the embodiment of the present disclosure, the OLED light source 20 is used as the backlight of the field sequential display panel, which, on one hand, can accurately control switch-on and switch-off of the respective sub-light-sources with higher flexibility, and can accurately control a brightness value of the trichromatic light, so that the field sequential display panel has a better display effect, and on the other hand, can avoid defects of the LED light as the backlight, so that the field sequential display device has a better performance.

Exemplarily, the shape of the pixel unit 101 in the liquid crystal display panel 10 is a square; and the distance between the liquid crystal display panel 10 and the OLED light source 20 is less than or equal to 10 times the side length of the pixel unit 101.

Thus, it can be ensured that all the monochromatic sub-light-sources of the OLED light source 20, i.e., light emitted from all the sub-light-sources of the first color 2011, light emitted from all the sub-light-sources of the second color 2012 and light emitted from all the sub-light-sources of the third color 2013 can be mixed uniformly when arriving at the liquid crystal display panel 10.

Further, any trichromatic light source unit 201 in the OLED light source 20 corresponds to 4 rows×4 columns or 5 rows×5 columns of the pixel units 101 in the liquid crystal display panel 10.

Here, if each trichromatic light source unit 201 is made to correspond to fewer pixel units 101, it means that the size of each sub-light-source of the OLED light source 20 is smaller; and if each trichromatic light source unit 201 is made to correspond to more pixel units 101, then in order that light arriving at the liquid crystal display panel 10 becomes uniform, it is necessary to increase the distance between the liquid crystal display panel 10 and the OLED light source 20. Therefore, in order to integrate the above-described two cases, in an embodiment of the present disclosure, one trichromatic light source unit 201 is made to correspond to 4 rows×4 columns or 5 rows×5 columns of the pixel units 101, that is, the size of the OLED light source 20 is controlled within a reasonable range, so as to be applicable to a conventional process, which can also avoid bringing about an excessive thickness to the field sequential display device.

Exemplarily, the OLED light source 20 is a display panel of an active matrix type, that is, each sub-light-source of the OLED light source 20 further includes a thin film transistor.

Further, in view of that materials emitting red light, green light and blue light in the OLED light source 20 are easier to prepare, and are applied more widely at present, the first color, the second color and the third color according to the embodiment of the present disclosure may be respectively red (R), green (G) and blue (B), that is, a light emitting layer 2015 in the sub-light-source of the first color 2011 is a red light emitting layer, a light emitting layer 2015 in the sub-light-source of the second color 2012 is a green light emitting layer, and a light emitting layer 2015 in the sub-light-source of the third color 2013 is a blue light emitting layer.

Based on the above, exemplarily, the OLED light source 20 may be an OLED display panel; and each of the trichromatic light source unit 201 corresponds to one pixel unit of the OLED display panel.

Hereinafter, unless otherwise specifically specified, in all illustrated examples, a case where the sub-light-source of the first color 2011 emits red light, the sub-light-source of the second color 2012 emits green light, and the sub-light-source of the third color 2013 emits blue light is taken.

An embodiment of the present disclosure provides a driving method for driving any of the above-described field sequential display panel/device; the structure of the field sequential display panel/device is as described above, which will not be repeated here.

Figure 2:
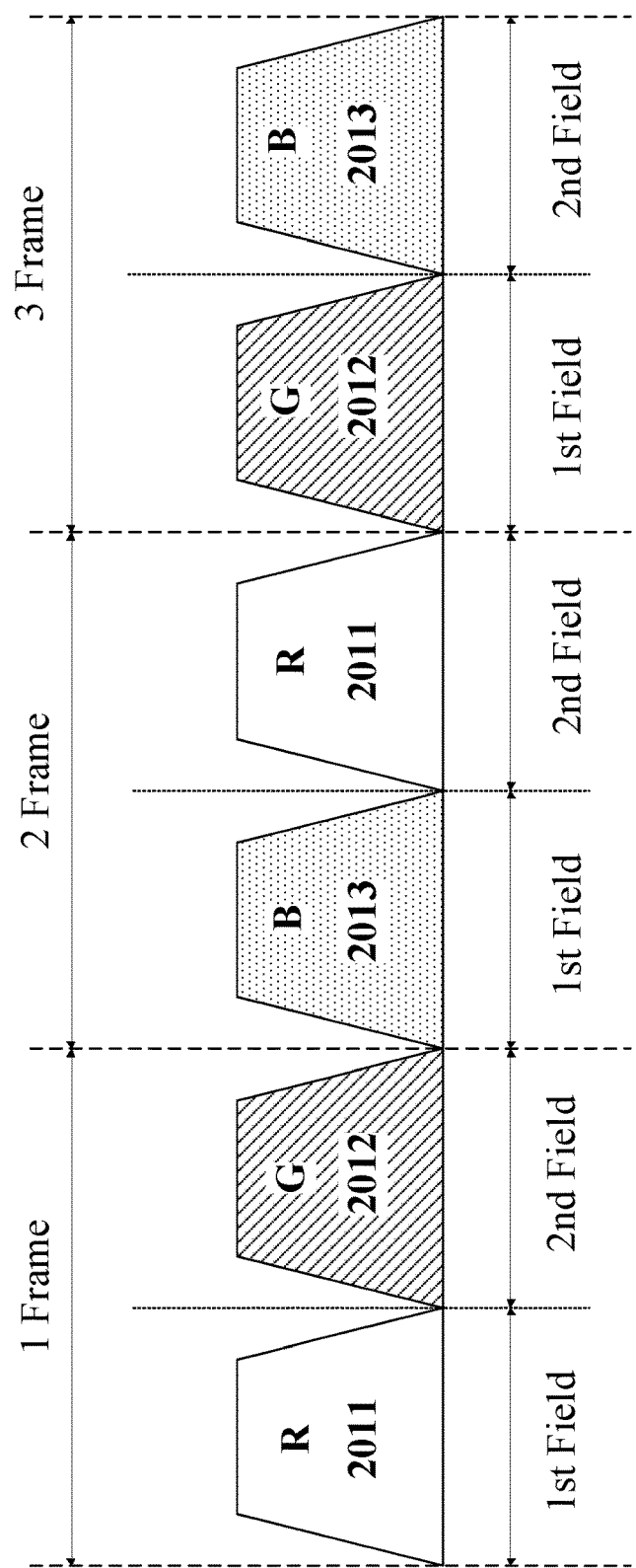
FIG. 2 is a schematic diagram of field sequential division corresponding to a driving method according to an embodiment of the present disclosure.

The driving method may comprise the following operations:

S101: driving a sub-light-source of a first color 2011 in an OLED light source 20 to emit light, in the first field of the first frame as illustrated in FIG. 2, and driving a sub-light-source of the second color 2012 in the OLED light source 20 to emit light in a second field of the first frame.

S102: driving a sub-light-source of a third color 2013 in the OLED light source 20 to emit light in the first field of the second frame, and driving the sub-light-source of the first color 2011 in the OLED light source 20 to emit light in the second field of the second frame. Here, the first field of the second frame is adjacent to the second field of the first frame.

S103: driving the sub-light-source of the second color 2012 in the OLED light source 20 to emit light in the first field of the third frame, and driving a sub-light-source of the third color 2013 in the OLED light source 20 to emit light in the second field of the third frame. Here, the first field of the third frame is adjacent to the second field of the second frame.

S104: driving liquid crystal in the liquid crystal display panel 10 to deflect in each field, so that light emitted from a pixel unit 101 of the liquid crystal display panel 10 reaches a target brightness value. During color display, the target color value to be displayed by the pixel unit of the liquid crystal display panel 10 corresponds to the target brightness value of the three primary colors.

Here, the first frame, the second frame and the third frame as described above constitute one driving cycle. In the above-described driving method, just by repeating the driving cycle, color field sequential display can be implemented.

Exemplarily, in half of the above-described driving cycle, the complete image information of one image is displayed, so that half a driving cycle may be less than visual retention time period of human eyes.

Here, since each frame includes only two fields, and each field only has the sub-light-source of one color to emit light, that is to say, in any frame, the sub-light-sources of only two colors are allowed to emit light; however, it is known to those skilled in the related art that, three primary colors must be mixed so as to implement colorful display, and based on this, an embodiment of the present disclosure, in a second field of a previous frame adjacent to the present frame and in a first field of a next frame adjacent to the present frame, respectively enables the sub-light-source of another color to emit light, so that light emitted from the sub-light-source of this another color in the above-described two fields compensate the present frame, so as to implement mixing of the three primary colors to implement color display.

To facilitate illustration, all embodiments described bellow provide illustrations with a case where light emitted from the sub-light-source of the first color 2011 is red (R), light emitted from the sub-light-source of the second color 2012 is green (G), and light emitted from the sub-light-source of the third color 2013 is blue (B) as an example.

An embodiment of the present disclosure provides a driving method of a field sequential display device, the field sequential display device comprising a liquid crystal display panel and an OLED light source, the OLED light source being used for providing a light source for the liquid crystal display panel; the liquid crystal display panel including a plurality of pixel units; the OLED light source includes a plurality of trichromatic light source units 201, each trichromatic light source unit 201 including a sub-light-source of a first color, a sub-light-source of a second color and a sub-light-source of a third color. Thus, the OLED light source may be used as the backlight of the liquid crystal display panel; since the OLED light source can accurately control switch-on and switch-off of the respective sub-light-sources, it has a higher flexibility and can reduce a thickness of the field sequential display device as compared with a field sequential display device using an LED light as the backlight.

In addition, the above-described driving method comprises: driving the sub-light-source of the first color in the OLED light source to emit light, in a first field of a first frame, and driving the sub-light-source of the second color in the OLED light source to emit light in a second field of the first frame; driving the sub-light-source of the third color in the OLED light source to emit light, in a first field of a second frame, and driving the sub-light-source of the first color in the OLED light source to emit light in a second field of the second frame; the first field of the second frame being next to the second field of the first frame; driving the sub-light-source of the second color in the OLED light source to emit light, in a first field of a third frame, and driving the sub-light-source of the third color in the OLED light source to emit light in a second field of the third frame; the first field of the third frame being next to the second field of the second frame; and driving liquid crystal in the liquid crystal display panel to deflect in each field, so that light emitted from a pixel unit of the liquid crystal display panel reaches a target brightness value. Here, the first frame, the second frame and the third frame as described above constitute one driving cycle. Thus, by repeating the above-described driving cycle, color field sequential display can be implemented; and since in the above-described driving method, each frame includes only two fields, the liquid crystal in the liquid crystal display panel only needs two times of reversion operation in each frame, so as to implement color field sequential display. Therefore, within the time of one frame, the number of times of reversion of liquid crystal is reduced, then response time of the liquid crystal is relatively increased, so as to reduce requirement on the response time of the liquid crystal.

It should be noted that, sequential orders among the above-described step S104 respectively with step S101, step S102 and step S103 are not limited in the embodiments of the present disclosure. Typically, in each field, step S104 may be performed first to deflect the liquid crystal, then, simultaneously or subsequently, step S101, step S102 and step S103 are performed so that the sub-light-source of the OLED light source 20 emits light. However, in order to reduce power consumption of the OLED light source 20, it may be that, after the liquid crystal is deflected completely, the OLED light source 20 emits light, so that rise in power consumption caused by increased time for the OLED light source 20 to emit light can be avoided, and thus, step S104 may be performed first, and then step S101, step S102 or step S103 is performed.

For example, one frame is obtained at 60 Hz, and the time period of each frame may be 1/60 s, i.e., 16.67 ms. The time of one frame is divided into two fields, and then the time period of each frame is 8.335 ms. In the first field of the first frame as illustrated in FIG. 2, the gate lines in the liquid crystal display panel 10 are scanned in a line-by-line mode by a gate electrode driving circuit, the data lines input data voltages so that the liquid crystal is deflected to a first angle, and the sub-light-source of the first color 2011 in the OLED light source 20 emits light; and then the operation process enters a next field, the liquid crystal display panel 10 scans the gate lines in a line-by-line mode by the gate electrode driving circuit, the data lines input data voltages so that the liquid crystal is deflected to a second angle, and the sub-light-source of the second color 2012 in the OLED light source 20 emits light.

Here, the first angle and the second angle as described above are related to a light transmittance of the liquid crystal display panel 10. Characteristics of the liquid crystal are different, and the deflection angles of the liquid crystal corresponding to same light transmittance are not always the same. When the characteristics of the liquid crystal are determined, the corresponding relationship between the light transmittance and the deflection angle of the liquid crystal can be found out by the characteristics of the liquid crystal.

Exemplarily, according to the brightness value of red light emitted by the sub-light-source of the first color 2011 as well as a target red-light brightness value, the light transmittance of the pixel unit of the liquid crystal display panel 10 in the first field, i.e., the light transmittance of the liquid crystal in the pixel unit, can be obtained, and according to the light transmittance of the liquid crystal and the type of the liquid crystal, the deflection angle of the liquid crystal in the pixel unit 101 in the first field can be obtained.

Similarly, according to the brightness value of green light emitted by the sub-light-source of the second color 2012 in the second field as well as a target green-light brightness value, the light transmittance of the pixel unit of the liquid crystal display panel 10 in the second field, i.e., the light transmittance of the liquid crystal in the pixel unit, can be obtained, and according to the light transmittance of the liquid crystal and the type of the liquid crystal, the deflection angle of the liquid crystal in the pixel unit in the second field can be obtained. Other deflection angles of the liquid crystal in each frame can be obtained similarly.

Based on the above, by providing a corresponding voltage across the pixel electrode and the common electrode in the liquid crystal display panel 10, the liquid crystal in the pixel unit of the liquid crystal display panel 10 in each field can be driven to deflect angularly.

Further, the color field sequential display method in which each frame includes two fields, so as to implement display by mixing the three primary colors will be illustrated in details hereinafter by exemplary embodiments.

For example, as illustrated in FIG. 2, in the first field of the second frame, blue (b) light is emitted by the sub-light-source of the third color 2013, and in the second field thereof, red (R) light is emitted by the sub-light-source of the first color 2011. Since in the second frame, the OLED light source 20 does not emit green (G) light, for a brightness value of green light in the second frame, it is necessary to superimpose brightness values of green light emitted by the sub-light-source of the second color 2012 in the second field of the first frame and first field of the third frame for display.

Exemplarily, the brightness values of green light emitted by the sub-light-source of the second color 2012 in the second field of the first frame and also in the first field of the third frame may be added and averaged, and the average value used as the brightness value of green light in the second frame. Because the time period of each frame is very short, by superimposing the brightness value of green light emitted by the sub-light-source of the second color 2012 in the second field of the first frame and the brightness value of green light emitted by the sub-light-source of the second color 2012 in the first field of the third frame, green light in the second frame is compensated, so that color display of each frame (i.e., display of the corresponding color value) can be realized.

Similarly, in order to obtain blue light in the first frame, it is necessary to superimpose blue light emitted by the sub-light-source of the third color 2013 in the 0th frame (not illustrated) and in the second frame; and to obtain red light in the third frame, it is necessary to superimpose red light emitted by the sub-light-source of the first color 2011 in the second frame and in the fourth frame (not illustrated). The specific superimposition method is as described above and will not be repeated here.

Based on the above, in order that light of various colors provided by the OLED display as the backlight is distributed uniformly, the time period of the first field and the time period of the second field as described may be the same.

Since in the embodiment of the present disclosure, one frame (60 Hz) is divided into two fields, the time of one field is 8.335 ms, as compared with the field sequential driving method in which the time period of the same frame is divided into three fields, with the time of one field being 5.56 ms, the response time for the liquid crystal of the liquid crystal display panel 10 to reverse in each field is increased to a certain extent, which, thus, can reduce requirement on the response time of the liquid crystal. In summary, the driving method provided by the embodiment of the present disclosure, can not only implement color display (e.g., RGB display), but also increase the response time for the liquid crystal, so as to alleviate the requirements on the response time of the liquid crystal during color field sequential display.

Further, in the driving cycle, brightness values of light emitted by the sub-light-sources of the respective colors in the OLED light source 20 are the same, so that brightness of the entire display panel becomes uniform.

In addition, an embodiment of the present disclosure further provides another driving method of a field sequential display panel/device; the specific structure of the field sequential display panel/device is the same as the specific structure provided by the foregoing embodiment, which will not be repeated here.

Figure 3:
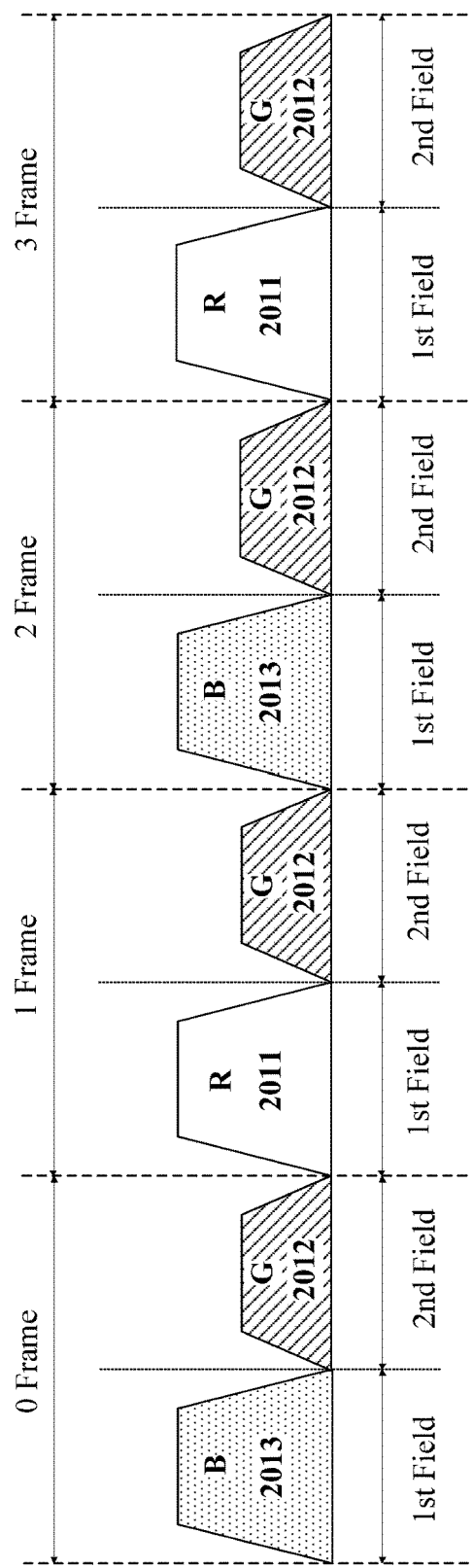
FIG. 3 is a schematic diagram of field sequential division corresponding to a driving method according to the embodiment of the present disclosure.

The driving method may comprise the following operation:

S201: driving a sub-light-source of a first color 2011 in an OLED light source 20 to emit light in the first field of the first frame as illustrated in FIG. 3, and driving a sub-light-source of a second color 2012 in the OLED light source 20 to emit light in the second field of the first frame.

S202: driving a sub-light-source of a third color 2013 in the OLED light source 20 to emit light in the first field of the second frame, and driving the sub-light-source of the second color 2012 in the OLED light source 20 to emit light in the second field of the second frame. Here, the first field of the second frame is adjacent to the second field of the first frame.

S203: driving liquid crystal in the liquid crystal display panel 10 to deflect in each field, so that light emitted from a pixel unit 101 of the liquid crystal display panel 10 reaches a target brightness value.

Here, the first frame and the second frame constitute one driving cycle. In the above-described driving method, just by repeating the driving cycle, color field sequential display can be implemented.

To facilitate illustration, all embodiments described below provide illustrations by taking a case where the sub-light-source of the first color 2011 emits red (R) light and the sub-light-source of the third color 2013 emits blue (B) light as an example.

In the above-described driving method, the OLED light source 20 emits green light through the sub-light-source of the second color 2012 in the second field of each frame, and thus, this solution only needs two frames to constitute one driving cycle; and each frame is divided into two fields, and thus, deflection time of the liquid crystal can be extended, and the requirement of color field sequential display on the response time of the liquid crystal is reduced.

In this case, since the human eyes are more sensitive to green light, on the basis that a higher sensitivity of the human eyes to green light is considered, hereinafter, a driving method for setting the above-described second field will be illustrated in details by specific embodiments, so that light of various colors provided by the OLED display as the backlight is distributed uniformly.

Embodiment One

As illustrated in FIG. 3, within one driving cycle, the brightness value of light emitted by the sub-light-source of the second color 2012 is half of the brightness value of light emitted by the sub-light-source of the first color 2011, the brightness value of light emitted by the sub-light-source of the first color 2011 is equal to the brightness value of light emitted by the sub-light-source of the third color; and the time of the first field is equal to the time of the second field.

Thus, in each frame, the sub-light-source of the second color 2012 emits green light in the second field. Thus, in one frame, light emitted by the sub-light-source of the second color 2012 matches the green data of this frame, while the color that does not exist in this one frame needs to be displayed by superimposing the data of the previous frame and the data of the next frame. For example, in the first field of the second frame, blue light is emitted by the sub-light-source of the third color 2013, and in the second field of the second frame, green light is emitted by the sub-light-source of the second color 2012. Because in the second frame, the OLED light source 20 does not emit red light, the red light of the second frame needs to be displayed by superimposing the red light data in the first field of the first frame and the red light data in the first field of the third frame.

Exemplarily, the brightness values of red light both in the first field of the first frame and in the first field of the third frame may be added and averaged, and the average value is used as the brightness value of red light in the second frame. Because the time period of each frame is very short, by superimposing red light emitted by the sub-light-source of the first color 2011 in the first field of the first frame and red light emitted by the sub-light-source of the first color 2011 in the first field of the third frame, red light in the second frame is compensated so as to implement RGB display.

Similarly, to obtain blue light in the first frame, it is necessary to superimpose blue light emitted by the sub-light-source of the third color 2013 in the 0th frame and in the second frame; the specific superimposition method is as described above, and will not be repeated here.

In the second field of each frame, the brightness value of green light emitted by the sub-light-source of the first color 2011 is half of a brightness value of red light or blue light, and thus, light source provided by the whole OLED light source 20 is distributed uniformly. Further due to the higher sensitivity of the human eyes to green light, in a very short period of time, the human eyes will not perceive reduction of green light, so that on the basis that a display effect is not affected, power consumption of the display device can be reduced.

Embodiment Two

Figure 4:
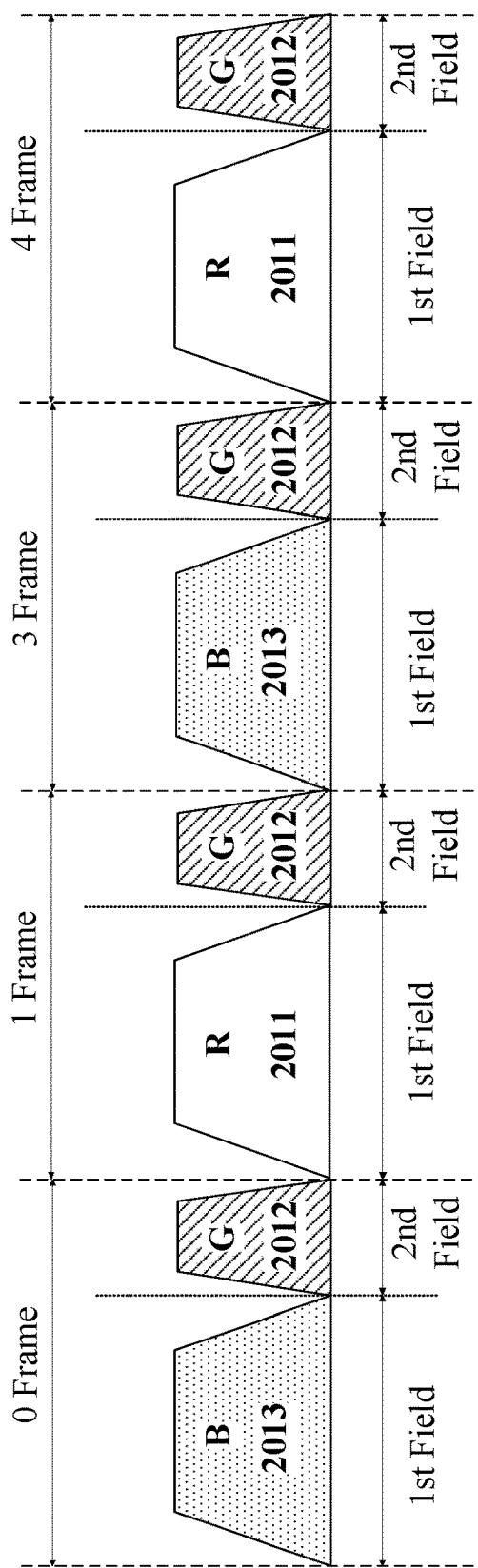
FIG. 4 is schematic diagram of another type of field sequential division corresponding to a driving method according to the embodiment of the present disclosure.

As illustrated in FIG. 4, within one driving cycle, brightness values of light emitted by the sub-light-sources of respective colors in the OLED light source are the same, and time of the first field is twice the time of the second field. Thus, in each frame, the sub-light-source of the second color 2012 emits green light in the second field. Thus, in one frame, light emitted by the sub-light-source of the second color 2012 matches the green data of this frame, while the color that does not exist in this frame needs to be displayed by superimposing the data of the previous frame and the data of the next frame. The specific superimposing mode is the same as that of Embodiment One, and will not be repeated here.

In the second field of each frame, the brightness value of the green light emitted by the sub-light-source of the first color 2011 is half of the brightness value of red light or blue light, and thus, light source provided by the whole OLED light source 20 is distributed uniformly. Due to a higher sensitivity of the human eyes to green light, in a very short period of time, the human eyes will not perceive reduction of green light, so that on the basis that the display effect is not affected, power consumption of the display device can be reduced.

The embodiments of the present disclosure provide a field sequential display panel, a field sequential display device and a driving method, the field sequential display device comprising the liquid crystal display panel, and further comprising: an OLED light source disposed on the light incident side of the liquid crystal display panel, which is configured for providing the trichromatic light to the pixel units of the liquid crystal display panel; the OLED light source includes: a plurality of trichromatic light source units, each trichromatic light source unit including the sub-light-source of the first color, the sub-light-source of the second color and the sub-light-source of the third color; and each sub-light-source including the anode, the cathode and the light emitting layer located between the anode and the cathode. Thus, the OLED light source may be used as the trichromatic light backlight of the liquid crystal display panel; because the OLED light source can accurately control switch-on and switch-off of the respective sub-light-sources, it has a higher flexibility and can reduce the thickness of the field sequential display device, as compared with the field sequential display device using the LED light as the backlight.

In addition, the above-described driving method comprises: driving the sub-light-source of the first color in the OLED light source to emit light, in a first field of a first frame, and driving the sub-light-source of the second color in the OLED light source to emit light in a second field of the first frame; driving the sub-light-source of the third color in the OLED light source to emit light, in a first field of a second frame, and driving the sub-light-source of the first color in the OLED light source to emit light in a second field of the second frame; the first field of the second frame being next to the second field of the first frame; driving the sub-light-source of the second color in the OLED light source to emit light, in a first field of a third frame, and driving the sub-light-source of the third color in the OLED light source to emit light in a second field of the third frame; the first field of the third frame being next to the second field of the second frame; and driving liquid crystal in the liquid crystal display panel to deflect in each field, so that light emitted from a pixel unit of the liquid crystal display panel reaches a target brightness value. Here, the first frame, the second frame and the third frame as described above constitute one driving cycle. Thus, by repeating the above-described driving cycle, color field sequential display can be implemented; and since in the above-described driving method, each frame includes only two fields, the liquid crystal in the liquid crystal display panel only needs two times of reversion in each frame, so as to implement color field sequential display. Therefore, with respect to a conventional technology, within the time of one frame, the number of times of reversion of liquid crystal is reduced, and therefore the response time of the liquid crystal is relatively increased, so as to reduce the requirement on the response time of the liquid crystal.

The foregoing embodiments merely are specific implementation modes of the present disclosure, but a protection scope of the present disclosure is not limited thereto, changes or replacements easily conceived by any skilled in art within the technical scope disclosed by the present disclosure should be covered by the protection scope of the present disclosure. Therefore, the protection scope of the present disclosure is determined by a protection scope of claims.

The present application claims priority of Chinese Patent Application No. 201510289387.1 filed on May 29, 2015, the disclosure of which is incorporated herein by reference in its entirety as part of the present application.

What is claimed is:

1. A field sequential display panel, comprising:
a lower substrate, including a base substrate and a plurality of pixel units disposed on the base substrate, each of the plurality of pixel units including a thin film transistor, a thickness of the base substrate is less than or equal to 10 times a side length of the pixel unit;
an upper substrate;
a liquid crystal layer, interposed between the lower substrate and the upper substrate; and
an organic light emitting diode (OLED) light source, disposed on a side of the base substrate away from the thin film transistor, which is configured for providing trichromatic light for each of the plurality of pixel units,
the OLED light source including: a plurality of trichromatic light source units, each trichromatic light source unit including a sub-light-source of a first color, a sub-light-source of a second color and a sub-light-source of a third color, wherein the first color, the second color and the third color are colors different from each other,
wherein the sub-light-source of the first color in the OLED light source is configured to emit light in a first field of a first frame and in a second field of a second frame, the sub-light-source of the second color in the OLED light source is configured to emit light in a second field of the first frame and in a first field of a third frame, the sub-light-source of the third color in the OLED light source is configured to emit light in a first field of the second frame and a second field of the third frame, wherein the first field of the second frame is next to the second field of the first frame, the first field of the third frame is next to the second field of the second frame, and the first frame, the second frame and the third frame constitute one driving cycle.

2. The field sequential display panel according to claim 1, wherein, each of the plurality of trichromatic light source units corresponds to more than one of the plurality of pixel units.

3. The field sequential display panel according to claim 1, wherein, the first color, the second color and the third color are respectively red, green and blue, or are respectively cyan, magenta or yellow.

4. The field sequential display panel according to claim 1, wherein, each sub-light-source in the sub-light-source of the first color, the sub-light-source of the second color and the sub-light-source of the third color includes an anode, a cathode and a light emitting layer located between the anode and the cathode.

5. The field sequential display panel according to claim 1, wherein, a shape of each of the pixel units is a square.

6. The field sequential display panel according to claim 1, wherein, each of the plurality of trichromatic light source units corresponds to 4 rows ×4 columns or 5 rows ×5 columns of the pixel units.

7. The field sequential display panel according to claim 6, wherein, each of the sub-light-sources further includes an electron transport layer, a hole transport layer, an electron injection layer, and a hole injection layer.

8. A driving method of the field sequential display panel according to claim 1, comprising:
driving a sub-light-source of a first color in the OLED light source to emit light in a first field of a first frame, and driving a sub-light-source of a second color in the OLED light source to emit light in a second field of the first frame;
driving a sub-light-source of a third color in the OLED light source to emit light in a first field of a second frame, and driving the sub-light-source of the first color in the OLED light source to emit light in a second field of the second frame; the first field of the second frame being next to the second field of the first frame;
driving the sub-light-source of the second color in the OLED light source to emit light in a first field of a third frame, and driving a sub-light-source of the third color in the OLED light source to emit light in a second field of the third frame; the first field of the third frame being next to the second field of the second frame;
driving liquid crystal in the liquid crystal layer to deflect in each of the first fields and the second fields, so that light emitted from each of the plurality of pixel units reaches a target brightness value;
wherein the first frame, the second frame and the third frame constitute one driving cycle.

9. The driving method according claim 8, wherein a time period of the first field is equal to a time period of the second field.

10. The driving method according claim 8, wherein, within the driving cycle, brightness values of light emitted by the sub-light-sources of respective colors in the OLED light source are identical.

11. The driving method according claim 8, wherein, light emitted from the sub-light-source of the first color, the sub-light-source of the second color and the sub-light-source of the third color is respectively red, green and blue.

12. A driving method of the field sequential display panel according to claim 1, comprising:
driving a sub-light-source of a first color in the OLED light source to emit light in a first field of a first frame, and driving a sub-light-source of a second color in the OLED light source to emit light in a second field of the first frame;
driving a sub-light-source of a third color in the OLED light source to emit light in a first field of a second frame, and driving the sub-light-source of the second color in the OLED light source to emit light in a second field of the second frame; the first field of the second frame being next to the second field of the first frame;
driving liquid crystal in the liquid crystal layer to deflect in each field, so that light emitted from each of the plurality of pixel units of the liquid crystal layer reaches a target brightness value;
wherein the first frame and the second frame constitute one driving cycle.

13. The driving method according to claim 12, wherein, within the driving cycle, a brightness value of light emitted by the sub-light-source of the second color is half of a brightness value of light emitted by the sub-light-source of the first color, the brightness value of light emitted by the sub-light-source of the first color is equal to a brightness value of light emitted by the sub-light-source of the third color; and a time period of the first field is equal to a time period of the second field.

14. The driving method according to claim 12, wherein, within the driving cycle, brightness values of light emitted by the sub-light-sources of respective colors in the OLED light source are identical, and the time period of the first field is twice the time period of the second field.

15. A field sequential display device, comprising:
a liquid crystal display panel, including:
an upper substrate and a lower substrate disposed opposite to each other; and
a liquid crystal layer, disposed between the upper substrate and the lower substrate; wherein the liquid crystal display panel includes a plurality of pixel units, and a distance between the liquid crystal display panel and the OLED light source is less than or equal to 10 times a side length of the pixel unit,
an organic light emitting diode (OLED) light source, located on a light incident side of the liquid crystal display panel, which is configured for providing trichromatic light for each of the plurality of pixel units of the liquid crystal display panel,
the OLED light source including: a plurality of trichromatic light source units, each trichromatic light source unit including a sub-light-source of a first color, a sub-light-source of a second color and a sub-light-source of a third color, wherein, the first color, the second color and the third color are colors different from each other,
wherein the sub-light-source of the first color in the OLED light source is configured to emit light in a first field of a first frame and in a second field of a second frame, the sub-light-source of the second color in the OLED light source is configured to emit light in a second field of the first frame and a first field of a third frame, the sub-light-source of the third color in the OLED light source is configured to emit light in a first field of the second frame and a second field of the third frame,
wherein the first field of the second frame is next to the second field of the first frame, the first field of the third frame is next to the second field of the second frame, and the first frame, the second frame and the third frame constitute one driving cycle.

16. The field sequential display device according to claim 15, wherein, each of the plurality of trichromatic light source units corresponds to more than one of the plurality of pixel units.

17. The field sequential display device according to claim 15, wherein, each of the sub-light-sources includes an anode, a cathode and a light emitting layer located between the anode and the cathode.

18. The field sequential display device according to claim 15, wherein, a shape of each of the plurality of pixel units in the liquid crystal display panel is a square.

19. The field sequential display device according to claim 15, wherein, the first color, the second color and the third color are respectively red, green and blue, or are respectively cyan, magenta or yellow.

20. The field sequential display device according to claim 15, wherein, the OLED light source is an OLED display panel, and each of the trichromatic light source units is a pixel unit of the OLED display panel.

* * * * *